United States Patent
Yokozeki et al.

(10) Patent No.: US 6,934,178 B2
(45) Date of Patent: Aug. 23, 2005

(54) NONVOLATILE DATA STORAGE CIRCUIT USING FERROELECTRIC CAPACITORS

(75) Inventors: Wataru Yokozeki, Kunitachi (JP); Shoichi Masui, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/647,439

(22) Filed: Aug. 26, 2003

(65) Prior Publication Data

US 2004/0085798 A1 May 6, 2004

(30) Foreign Application Priority Data

Aug. 27, 2002 (JP) ........................................ 2002-247347

(51) Int. Cl.$^7$ .............................................. G11C 11/22
(52) U.S. Cl. .................................... 365/145; 365/189.05
(58) Field of Search ........................... 365/145, 189.05, 365/117, 65

(56) References Cited

U.S. PATENT DOCUMENTS

| | | | | |
|---|---|---|---|---|
| 5,936,832 A | * | 8/1999 | Saito et al. | 365/149 |
| 6,097,622 A | * | 8/2000 | Shimizu et al. | 365/145 |
| 6,141,237 A | | 10/2000 | Eliason et al. | |

* cited by examiner

*Primary Examiner*—Thong Q. Le
(74) *Attorney, Agent, or Firm*—Arent Fox PLLC (57) ABSTRACT

A nonvolatile data storage circuit has a data holding circuit having a storage node, and a plurality of ferroelectric capacitors one electrodes of which are connected to the storage node. In this nonvolatile data storage circuit, in store operations to write data from the data holding circuit to the ferroelectric capacitors, the timing of at least the rising or the falling of plate signals supplied to the other electrodes of the plurality of ferroelectric capacitors, is made different. During store operation, the timing of the plate signals applied to the plurality of ferroelectric capacitors connected to the storage node is shifted, so that coupling noise between the ferroelectric capacitors is dispersed and can be reduced, and data inversion of the data holding circuit can be prevented.

14 Claims, 13 Drawing Sheets

FIG. 1

PRIOR ART

FIRST EXAMPLE

SECOND EXAMPLE

NONVOLATILE DATA STORAGE CIRCUIT USING FERROELECTRIC CAPACITORS

CROSS-REFERENCE TO RELATED APPLICATIONS

This application is based upon and claims the benefit of priority from the prior Japanese Patent Application No. 2002-247347, filed on Aug. 27, 2002, the entire contents of which are incorporated herein by reference.

BACKGROUND OF THE INVENTION

1. Field of the Invention

This invention relates to a nonvolatile data storage circuit using ferroelectric capacitors, and in particular, to a nonvolatile data storage circuit capable of stabilizing storage operation when the power supply is off.

2. Description of the Related Art

One type of data storage circuit capable of high-speed operation is a latch circuit in which a pair of inverter inputs and outputs are cross-connected. Latch circuits are used as element circuits in flip-flops, or are used as SRAM memory cells. A latch circuit is itself a volatile data storage circuit, in which the held data is lost when the power supply falls. Therefore, nonvolatile data storage circuits have been proposed.

Figure 1:
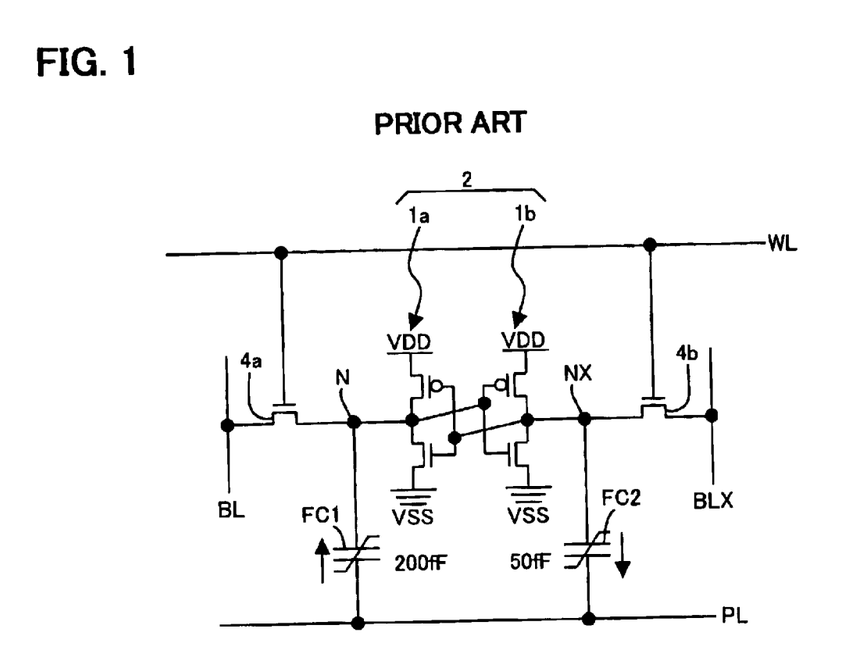
FIG. 1 is a circuit diagram of a conventional memory cell using ferroelectric capacitors.

As a nonvolatile data storage circuit, in the non-patent document 1 described below, a device in which ferroelectric capacitors are connected as variable-capacitance capacitors to the storage nodes of a latch circuit forming an SRAM memory cell. FIG. 1 is a circuit diagram of the memory cell. This memory cell comprises a latch circuit 2 in which the input and output terminals of CMOS inverters 1a, 1b are cross-connected; transfer gates 4a, 4b whose gates are connected to the word line WL and either sources or drains are connected to bit lines BL, BLX; and ferroelectric capacitors FC1, FC2 connected to the pair of storage nodes N, NX of the latch circuit 2. The electrodes on the opposite sides of the ferroelectric capacitors FC1, FC2 are connected to the plate line PL.

In the latch circuit 2 comprising the pair of inverters, data is lost when the power supply is interrupted. However, by connecting the ferroelectric capacitors FC1, FC2 to the pair of storage nodes N, NX, the polarization direction of the ferroelectric films in the ferroelectric capacitors can be controlled according to the voltage levels of the storage nodes, and this polarization direction is maintained as a residual polarization even after the power supply falls.

For example, if node N is at L level and node NX is at H level, when the plate line PL is at L level, a voltage is applied to the ferroelectric capacitor FC2, and the polarization direction becomes the direction of the arrow. When the plate line PL is driven to H level, a voltage is applied in the reverse direction to the ferroelectric capacitor FC1, and the polarization direction becomes the opposite direction. This polarization direction is maintained even if the power supply falls, due to the hysteresis characteristic of the ferroelectric film. The above operation associated with the plate line is called a store operation.

When the power supply is turned on, the power supply voltage VDD gradually rises; but due to differences in the polarization direction, the capacitances of the ferroelectric capacitors as seen from nodes N and NX are such that FC1>FC2. Consequently the rise in voltage levels at the nodes N and NX due to currents flowing via the p-channel transistors of the inverters 1a and 1b, accompanying the rise of the power supply voltage VDD, is slower on the side of the capacitor FC1 with larger capacitance, and faster on the side of the capacitor FC2 with smaller capacitance. As a result, a voltage difference is created between the nodes N and NX, and through the amplification action of the latch circuit 2, the L level and H level of the nodes N and NX prior to power supply interruption are restored. This operation is called "recall operation".

Non-patent reference 1: T. Miwa et al, "A 512 kbit low-voltage NV-SRAM with the size of a conventional SRAM," 2001 Symposium on VLSI Circuits, Digest of Technical Papers.

In the nonvolatile data holding circuit shown in FIG. 1, when the power supply voltage VDD is lower level, the transistor leakage currents of the inverters 1a and 1b cause the ferroelectric capacitors FC1 and FC2 to be charged. Hence the voltages at the nodes N and NX are determined by the charging leakage currents and by the capacitances of the ferroelectric capacitors FC1 and FC2. Here a leakage current charging a capacitor is the difference between the p-channel transistor leakage current and the n-channel leakage current. This transistor leakage current differs greatly due to distribution in threshold voltages. For example, when the threshold voltage scattering is dVth=80 mA, the leakage current is different by nearly one order.

Hence depending on scattering in the threshold voltages of the transistors comprised by the latch circuit, the H level and L level may be inverted in the recall operation. Scattering in threshold voltages depends on device fabrication processes, and cannot easily be reduced.

In order to resolve this problem, the applicant previously submitted patent applications, proposing improved nonvolatile data holding circuits using ferroelectric capacitors. One such example is Japanese Patent Laid-open No. 13-400507 (filed Dec. 28, 2001). In this improved version, a transistor for activation is provided on the power supply side of the latch circuit, and in recall operation, initially the plate line PL is driven, voltages are generated at the pair of storage nodes of the latch circuit according to the polarization directions of the ferroelectric capacitors, and thereafter the activation transistor is driven to activate the latch circuit, the voltage difference between the storage nodes is amplified, and the original data is latched.

In this improved version, a pair of ferroelectric capacitors are connected to each of the storage nodes of the latch circuit, two plate lines are driven to store data when interrupting the power supply, and when the power supply is turned on, one of the plate lines is driven to recall the data. The difference in capacitances of the pair of ferroelectric capacitors can be utilized to generate a large voltage difference between the storage nodes of the latch circuit through the recall operation.

However, in this improved version, when the two plate lines are driven in the store operation, coupling noise between the ferroelectric capacitors may cause the levels of the pair of storage nodes of the latch circuit to be inverted. Transistor connection capacitances, wiring capacitances, and other parasitic capacitances are connected to the storage nodes; but the capacitances of the ferroelectric capacitors are extremely large compared with these parasitic capacitances. Hence the effect of the above coupling noise is great, and consequently the storage node levels fluctuate considerably so that the data of the latch circuit may be inverted, and failure in writing data to the ferroelectric capacitors may occur.

The above problems are prominent when the size of transistors in the latch circuit is decreased and the current driving capacity is reduced in order to raise integration densities, and when there exists an imbalance in the performance of the inverters of the latch circuit or an imbalance in the parasitic capacitances of the storage nodes.

SUMMARY OF THE INVENTION

Hence an object of this invention is to provide a nonvolatile data storage circuit using ferroelectric capacitors which operates stably.

A further object of this invention is to provide a nonvolatile data storage circuit using ferroelectric capacitors, the storage operation of which is stabilized.

A further object of this invention is to provide a nonvolatile data storage circuit using ferroelectric capacitors, which enables rewriting during recall.

In order to achieve the above objects, in a first aspect of this invention, a nonvolatile data storage circuit has a data holding circuit having a storage node, and a plurality of ferroelectric capacitors one electrodes of which are connected to the storage node. In this nonvolatile data storage circuit, in store operations to write the data of the data holding circuit to the ferroelectric capacitors, the timing of at least the rising or the falling of plate signals supplied to the other electrodes of the plurality of ferroelectric capacitors, is made different.

In the above first aspect, during store operation, the timing of the plate signals applied to the plurality of ferroelectric capacitors connected to the storage node is shifted, so that coupling noise between the ferroelectric capacitors is dispersed and can be reduced, and data inversion of the data holding circuit can be prevented.

In a preferred embodiment of the above invention, the timing of the falling edge of a first plate signal and of the rising edge of a second plate signal, applied to two ferroelectric capacitors, is made coincident. That is, the first plate signal is applied initially, and the second plate signal is made to rise with the same timing as the falling edge of the first plate signal. By this means, the phases of the coupling noise between the two capacitors are inverted and the noise is canceled, so that data inversion can be prevented.

In order to achieve the above objects, in a second aspect of this invention, a nonvolatile data storage circuit has a data holding circuit having a storage node, and a pair of ferroelectric capacitors one electrode of each of which is connected to the storage node. In the nonvolatile data storage circuit, during recall operation to rewrite to the data holding circuit the data of the ferroelectric capacitors, the timing of the plate signals supplied to the other electrodes of the pair of ferroelectric capacitors is shifted, the data holding circuit is activated so that data is latched when a first plate signal is applied, and subsequently a second plate signal is applied.

In the above second aspect, a voltage is generated at the storage node due to application of the first plate signal, and at this time the data holding circuit is activated and data is restored. At this time, data is rewritten to the first ferroelectric capacitor. Then, by applying the second plate signal, data is also rewritten to the second ferroelectric capacitor.

DESCRIPTION OF THE PREFERRED EMBODIMENTS

Below, aspects of this invention are explained, referring to the drawings. However, the scope of protection of this invention is not limited to the following aspects, but extends to the inventions described in the Scope of claims and to inventions equivalent thereto.

Figure 2:
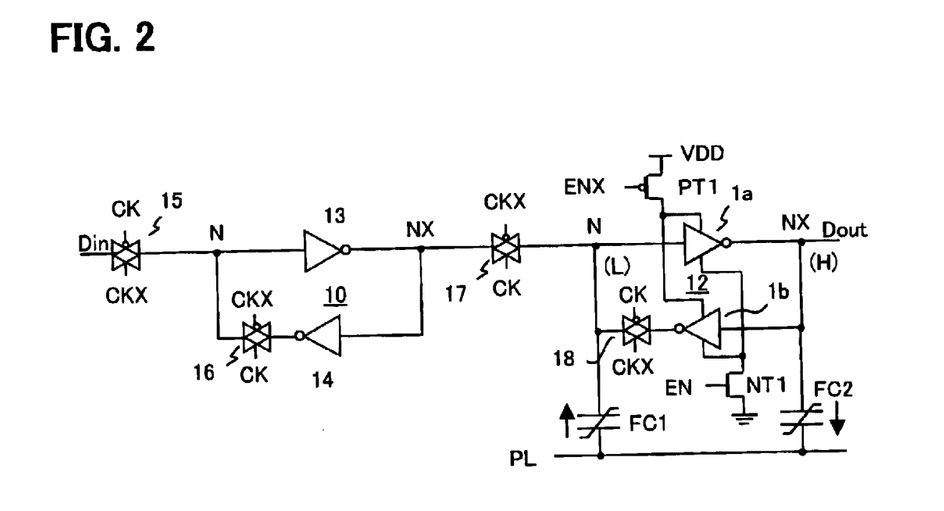
FIG. 2 is a circuit diagram of a nonvolatile flip-flop circuit disclosed in a previous patent application specification.

FIG. 2 is a circuit diagram of a nonvolatile flip-flop circuit disclosed in the above-mentioned preceding patent application specification. This flip-flop is a D-type flip-flop comprising a former-stage master latch circuit 10 and a latter-stage slave latch circuit 12. The master latch circuit 10 comprises a pair of inverters 13, 14 and transfer gates 15, 16; the input data Din is input when the clock CK is at L level, and this is latched when the clock CK is at H level. The slave latch circuit 12 also comprises a pair of inverters 1a, 1b and transfer gates 17, 18; when the clock CK is at H level, the output of the master latch circuit is input, and this is latched when the clock CK is at L level. The data held by the slave latch circuit 12 is output as the output data Dout.

In the example of FIG. 2, the ferroelectric capacitors FC1, FC2 are respectively connected to the pair of storage nodes N, NX of the slave latch circuit 12, and the plate signal PL is applied to the opposite-side electrodes of the capacitors. Also, activation transistors PT1, NT1 are provided on the high-power-supply side and the low-power-supply side, respectively, of the inverters 1a, 1b of the slave latch circuit 12, and the activation signals EN, ENX are applied to the gates of these activation transistors. Hence in the flip-flop of FIG. 2, the data held by the slave latch circuit is held by the capacitors FC1, FC2 even when the power supply is turned off.

The store operation of the slave latch circuit before the power supply falls is the same as in the conventional example; if the latch circuit maintains the L level and H level at the storage node pair N, NX respectively, then the plate signal PL changes from L level to H level and then to L level, and polarization states indicated by the arrows occur in the ferroelectric capacitors FC1, FC2. The recall operation when the power supply is turned on differs from the conventional example; the plate signal PL is driven from L level to H level, a voltage difference is generated between the storage nodes N, NX of the latch circuit according to the polarization states, and thereafter, when the activation signals EN, ENX are driven to the H level and L level respectively, the latch circuit 12 is activated, the voltage difference between the storage node pair is amplified, and the original data is latched.

In the nonvolatile latch circuit of FIG. 2, a voltage difference is generated between the storage node pair N, NX by the difference in capacitance values of the ferroelectric capacitors FC1, FC2. However, a sufficient voltage difference cannot be generated solely by the difference in capacitances of the two capacitors. Hence a plurality of ferroelectric capacitors are connected to the storage node pair, and during recall operation a larger voltage difference is generated between the storage node pair.

Figure 3:
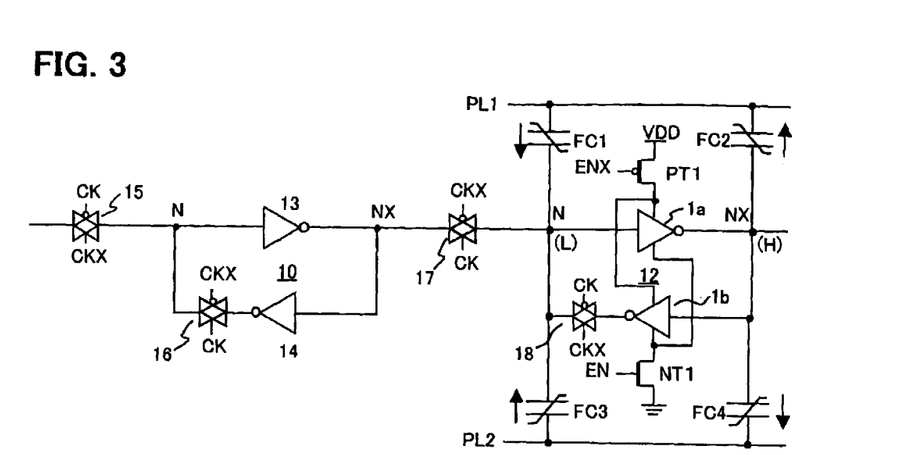
FIG. 3 is a circuit diagram of another nonvolatile flip-flop circuit disclosed in a previous patent application specification.

FIG. 3 is a circuit diagram of another nonvolatile flip-flop circuit disclosed in the preceding patent application specification; as described above, pairs of ferroelectric capacitors FC1, FC3 and FC2, FC4 are connected to the respective storage nodes N and NX. A first plate line PL1 and second plate line PL2 are connected to the opposite-side electrodes of these capacitors.

Figure 4:
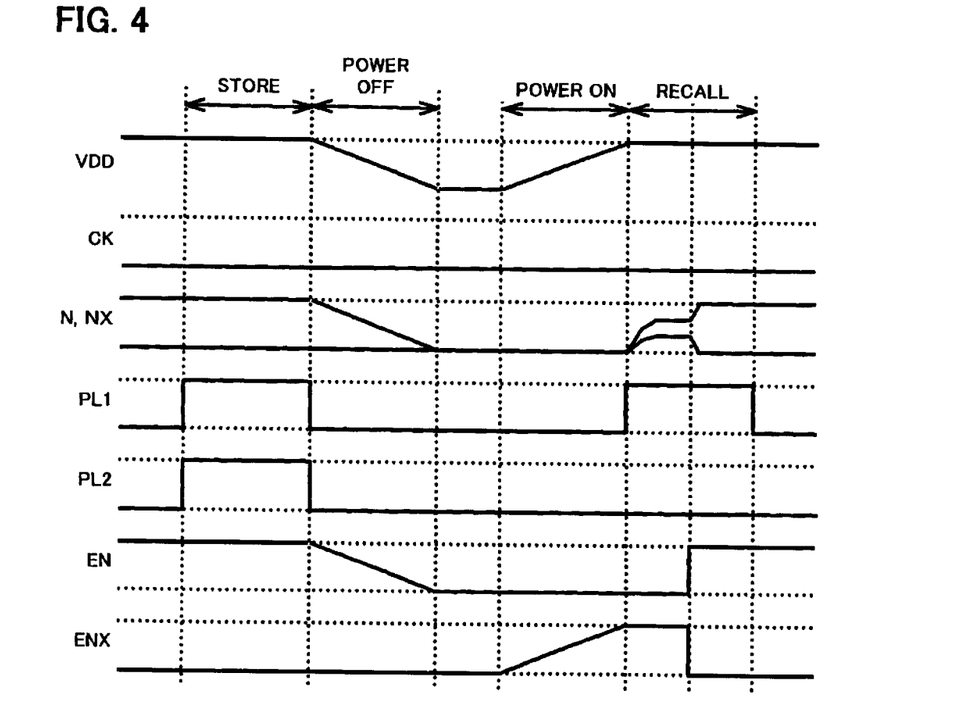
FIG. 4 is an operation waveform diagram of the nonvolatile flip-flop circuit of FIG. 3.
Figure 5:
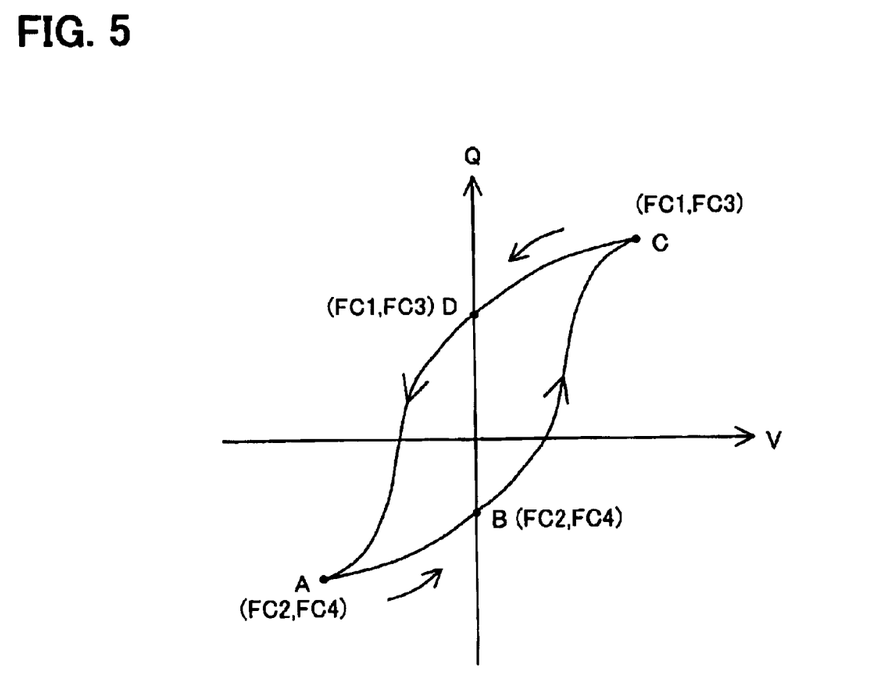
FIG. 5 is a diagram showing the polarization direction in a ferroelectric capacitor.
Figure 6:
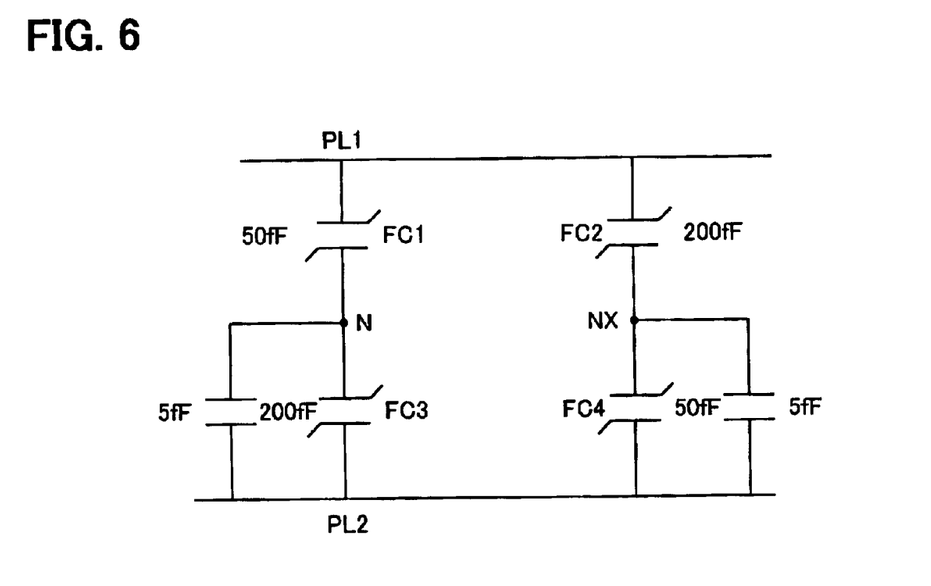
FIG. 6 is an equivalent circuit diagram of the capacitance connected to the storage node pair N, NX.

FIG. 4 is an operation waveform diagram of the nonvolatile flip-flop of FIG. 3. FIG. 5 is a diagram showing the polarization direction of a ferroelectric capacitor, and FIG. 6 is an equivalent circuit diagram of the capacitances connected to the storage node pair N, NX. The operation of the nonvolatile flip-flop is explained referring to these drawings.

Suppose that the latch circuit 12 is in a state in which node N is at L level and node NX is at H level. In this state, a store operation is performed before the power supply is turned off. As shown in FIG. 4, the first and second plate signals PL1, PL2 are raised simultaneously from L level (ground voltage) to H level (power supply voltage), and then again set at L level. When both plate signals are at L level, a negative-direction voltage is applied to the ferroelectric capacitors FC2 and FC4, the ferroelectric films of the capacitors FC2, FC4 move to point A on the hysteresis curve, and polarization in the direction of the arrow occurs. Thereafter, when the plate signals PL1 and PL2 are sent to H level, the voltage applied to the ferroelectric capacitors FC2 and FC4 vanishes, and the capacitors FC2, FC4 move to point B. On the other hand, a positive-direction voltage is applied to the ferroelectric capacitors FC1 and FC3, the capacitors FC1, FC3 move to point C, and polarization occurs in the direction of the arrow opposite that of FC2 and FC4. Then, when the plate signals PL1 and PL2 are sent to L level, the capacitors FC1 and FC3 move to point D, and the capacitors FC2 and FC4 move to point A.

By this means, the data of the latch circuit 12 is held by the four ferroelectric capacitors. Thereafter, when the power supply is interrupted, the voltage levels at the storage node pair N, NX of the latch circuit 12 disappear, and the capacitors FC2 and FC4 move to point B. Upon interruption of the power supply the data held by the latch circuit disappears, but remains as a residual polarization in the ferroelectric capacitors, so that the data is maintained.

Next, when the power supply is turned on, as the power supply voltage VDD rises, the activation signal ENX controlled to H level also rises. Thus the activation signal EN is controlled to L level and the signal ENX which is the inversion of same is controlled to H level, and the latch circuit 12 enters an unactivated state. When the first plate signal PL1 is driven from L level to H level, a voltage with the same direction as during storing is applied to the ferroelectric capacitors FC1 and FC2, and a voltage in the direction opposite that during storing is applied to the ferroelectric capacitors FC3 and FC4. In other words, when the first plate signal PL1 goes to H level, the ferroelectric capacitors FC1 and FC2 move to point C from D and B on the hysteresis curve, and the ferroelectric capacitors FC3 and FC4 move to point A from D and B. The charge amount Q for the same applied voltage V is different for each capacitor, so that the capacitances C of the capacitors are, from C=Q/V, such that FC1<FC3 and FC2>FC4. If small capacitances are 50 fF, large capacitances are 200 fF, and the parasitic capacitances at the storage nodes N, NX are 5 fF, then the equivalent circuit is as shown in FIG. 6.

The voltages Vn, Vnx at the storage nodes N, NX when the first plate signal PL1 goes to H level (3.3 V) are, from division of the capacitances connected to each of the nodes, $$Vn=3.3V\times(50fF/(5fF+50fF+200fF))=0.65V$$

$$Vnx=3.3V\times(200fF/(5fF+50fF+200fF))=2.59V$$

By connecting one pair of ferroelectric capacitors to each of the storage nodes N and NX, and utilizing the relations FC1<FC3 and FC2>FC4 during the recall operation, a larger voltage difference can be generated between the storage nodes. In this state, when the activation signals EN and ENX of the latch circuit are driven to H level and L level respectively, the latch circuit 12 is activated, the voltage difference between the storage node pair is amplified, and the original data can be reliably latched.

FIG. 7 explains the problems of FIG. 3 and FIG. 4. As shown in FIG. 6, comparing with the parasitic capacitance 5 fF at the storage nodes N, NX, the capacitance values of the ferroelectric capacitors FC1 to FC4 are quite large. Hence during store operations, when the plate signals PL1 and PL2 rise from L level to H level, and when they fall from H level to L level, coupling noise is superimposed at the storage nodes N and NX.

In FIG. 7, at the time when the first and second plate signals PL1, PL2 rise, the nodes NX, N rise together through coupling, and the voltage difference dV1 at the regular state changes to dV2. Also, at the time when the plate signals falls, the nodes NX, N fall together so that the voltage difference is reduced to dV3. This example is a waveform which appears when, for example, the driving ability of the p-channel transistor of the inverter 1a driving the node NX is small, and the driving ability of the n-channel transistor of the inverter 1b driving the node N is large. Also, this waveform appears when the parasitic capacitance of the node NX is small and the parasitic capacitance of the node N is large.

In other words, the coupling noise by the rising edge of the plate signal is absorbed by the operation of the latch circuit 12, and the action tends to maintain the storage nodes N, NX in the L and H level states. However, when the driving ability of the p-channel transistor of the inverter 1a is weak, and the driving ability of the n-channel transistor of the inverter 1b is large, the level of the node NX driven to the H-level side by the p-channel transistor of the inverter 1a is greatly affected by the coupling noise so that the voltage fluctuation thereof is increased. On the other hand, at the node N with the L-level side driven by the n-channel transistor of the inverter 1b the coupling noise is absorbed, so that the voltage fluctuation is smaller. Consequently the voltage difference dV3 between the two storage nodes becomes extremely small at the falling edge of the plate signals PL1, PL2. In the worst case, as shown in FIG. 7B, the voltage levels of the storage node pair may be inverted. This results in failure of the store operation.

Figure 7A:
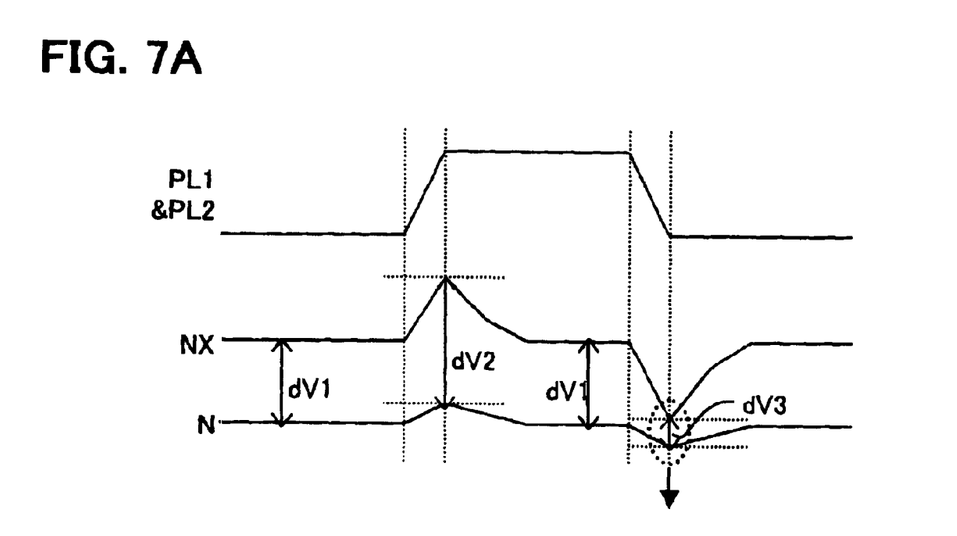
FIG. 7 is a diagram which explains problems with FIG. 3 and FIG. 4.
Figure 7B:
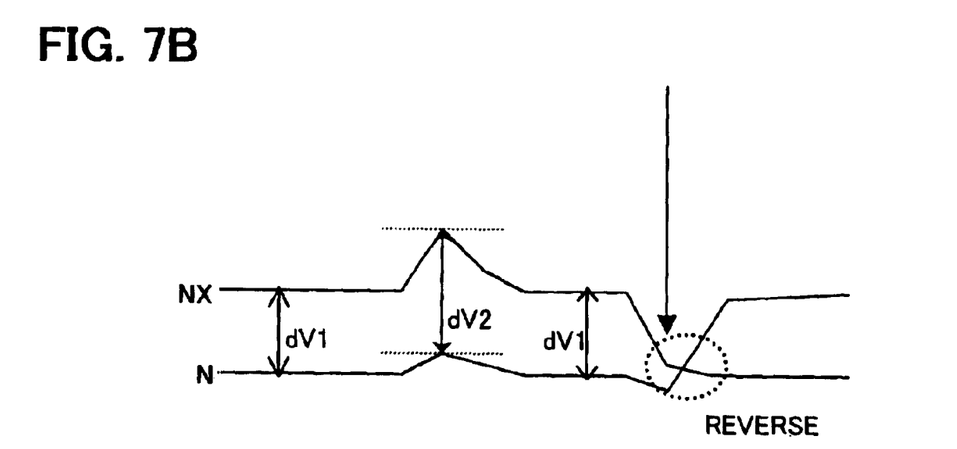

When characteristic scattering is opposite of the above occurs, that is, when the driving ability of the p-channel transistor of the inverter 1a is large and the driving ability of the n-channel transistor of the inverter 1b is small, then there is the danger of occurrence of data inversion at the rising edges of the plate signals PL1 and PL2 in FIG. 7A. That is, coupling noise causes the voltage at node N to rise higher and the voltage at node NX to not rise much, so that the voltage difference dV2 becomes extremely small.

The above data inversion problem occurs similarly when there is imbalance in the parasitic capacitances of the storage nodes of the latch circuit. In ordinary latch circuits, the capacitances of the inverter and node pair may be formed with an imbalance such that latch inversion readily occurs. In the case of such a latch circuit, the above problem becomes serious. In addition, manufacturing variability may also give rise to imbalance in inverter capacities.

Figure 8:
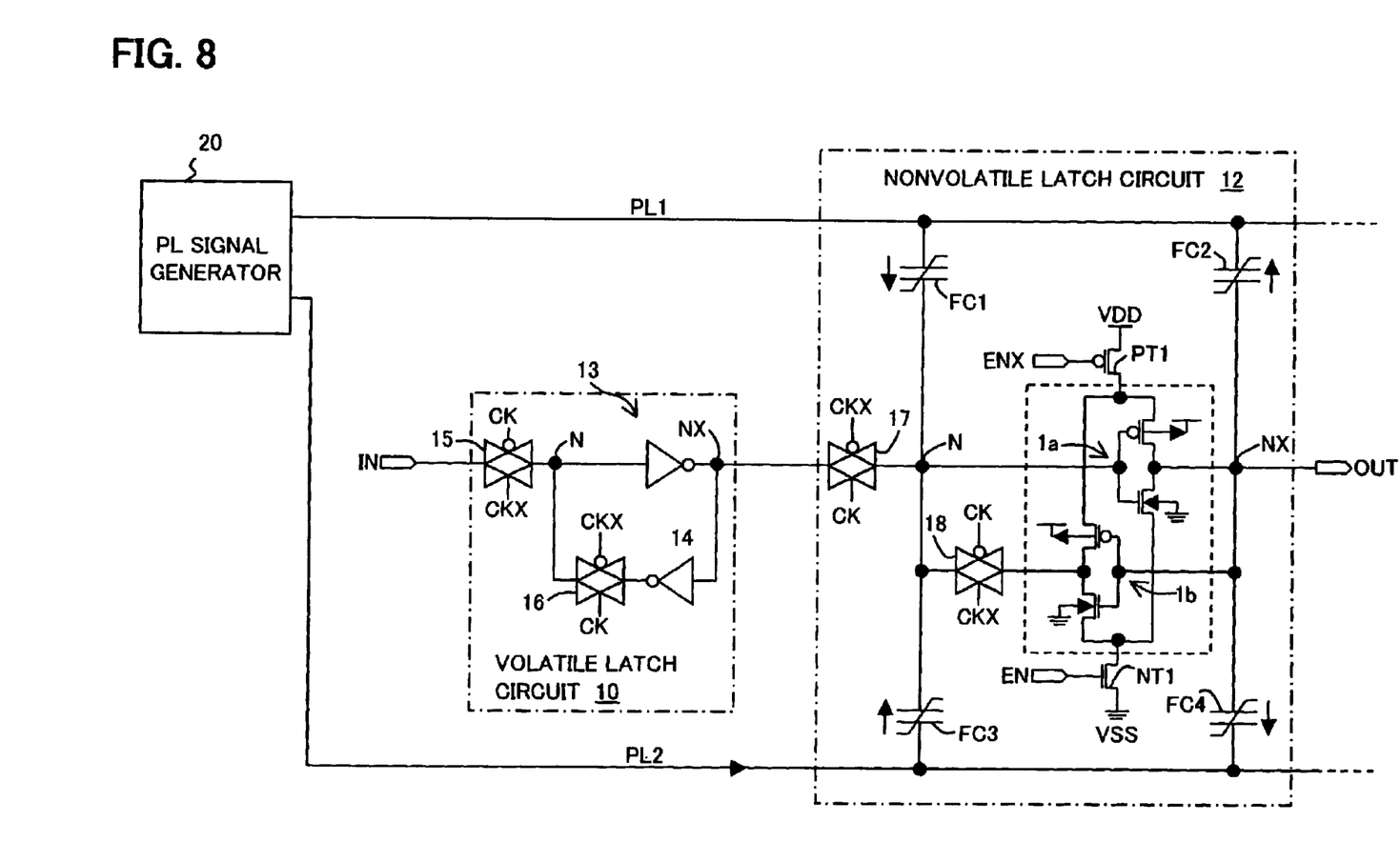
FIG. 8 is a circuit diagram of a nonvolatile flip-flop circuit of this aspect.

FIG. 8 is a circuit diagram of a nonvolatile flip-flop of this embodiment. The same citation numbers as in FIG. 3 are assigned; the flip-flop comprises a master latch circuit 10 and slave latch circuit 12; the master latch circuit 10 has inverters 13 and 14, and the slave latch circuit 12 has inverters 1a and 1b. FIG. 8 shows the specific CMOS inverter circuit of the inverters 1a and 1b. For the p-channel transistors of these inverters, the power supply VDD is connected to the substrate (n-type semiconductor), and for the n-channel transistors, the ground voltage VSS is connected to the substrate (p-type substrate). These transistors are connected to the power supply VDD and ground VSS via the activation transistors PT1 and NT1.

In the nonvolatile flip-flop of FIG. 8, the slave latch circuit 12 has ferroelectric capacitors FC1 to FC4, so as to be a nonvolatile latch circuit. First and second plate signals PL1 and PL2 supplied to these ferroelectric capacitors are generated by the plate signal generator circuit 20. In this embodiment, the timing of the first and second plate signals PL1 and PL2 generated by this plate signal generator circuit 20 differs from the example of FIG. 7.

Figure 9:
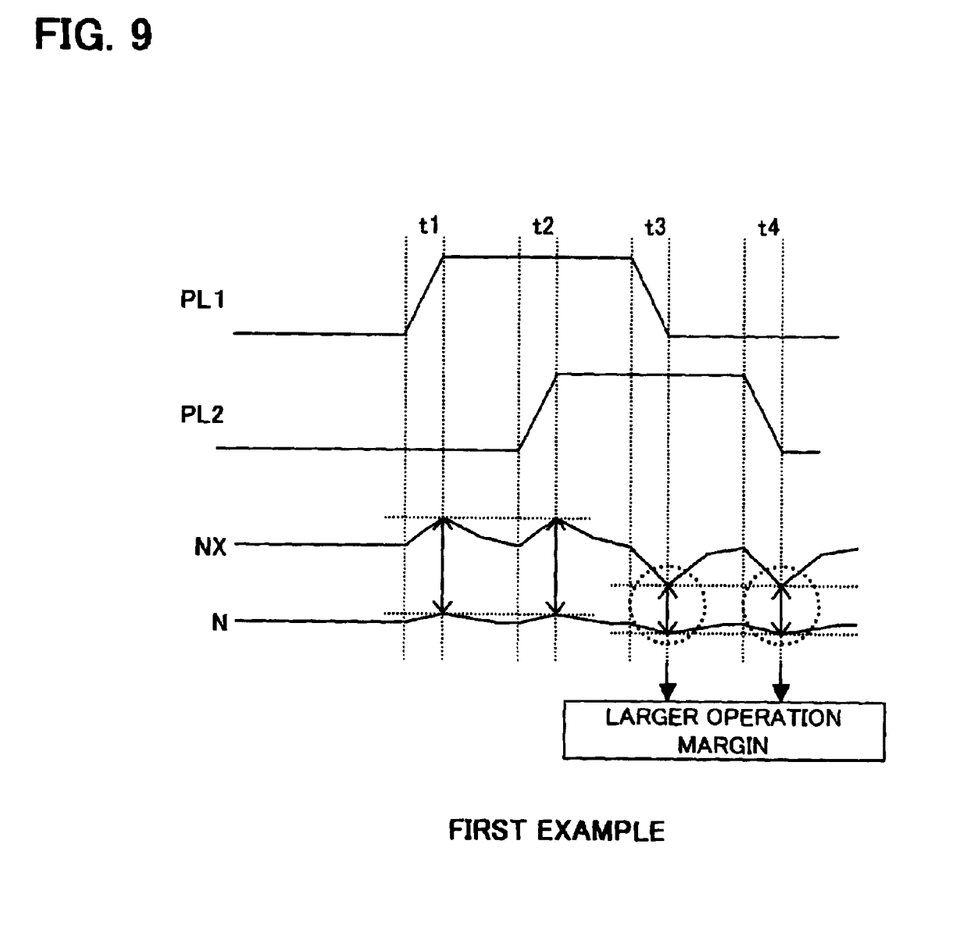
FIG. 9 is a waveform diagram showing a first example of a plate signal in this aspect.

FIG. 9 is a waveform diagram showing a first example of a plate signal of this aspect. FIG. 9 shows the first and second plate signals PL1 and PL2 in the store operation when the power supply is turned off, as well as the waveforms of the storage node pair N and NX of the latch circuit. In the first example, the first plate signal PL1 rises at time t1, and then, after a prescribed time has elapsed, the second plate signal PL2 rises at time t2. Then, at time t3 the first plate signal PL1 falls, and subsequently at time t4 the second plate signal PL2 falls.

In this way, by shifting the timing of the rising and falling of the first and second plate signals PL1, PL2, the coupling noise accompanying driving of the two plate signals is no longer superimposed, and the coupling noise is dispersed. Hence the magnitude of the coupling noise at the times t1 to t4 can be reduced, and as a result the voltage fluctuation at the storage nodes N, NX can be reduced. Consequently, as shown in FIG. 9, the operating margins at times t3 and t4 are increased, and inversion of the voltage levels at the storage nodes due to coupling noise does not readily occur. In this example, it is assumed that the driving ability of the p-channel transistor of the inverter 1a is small, and that the driving ability of the n-channel transistor of the inverter 1b is large. In the converse case also, however, the timing of plate signal rising is shifted at times t1 and t2, and so the operating margin under these conditions is also increased.

In the first example, the rise and fall timing of the first and second plate signals should be respectively shifted. Hence for example, initially the first plate signal PL1 rises, and after the second plate signal PL2 then rises the second plate signal PL2 may fall, followed by the fall of the first plate signal PL1. Or, the order of the first and second plate signals may be reversed. In any case, by dispersing the coupling operation due to the ferroelectric capacitors accompanying the plate signal driving, data inversion of the latch circuit can be suppressed.

Figure 10:
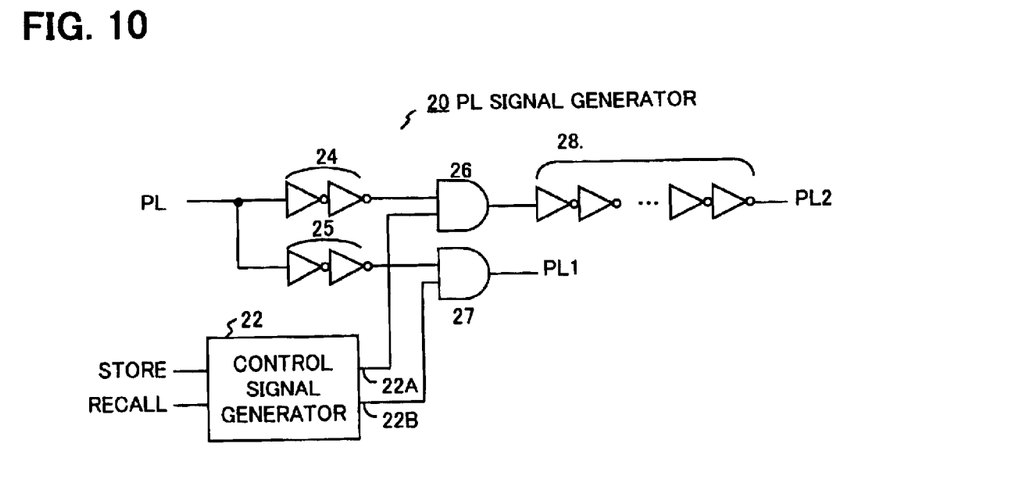
FIG. 10 is a plate signal generator circuit diagram to generate a first waveform example.

FIG. 10 is a circuit diagram of the plate signal generator circuit which generates the first waveform example. This plate signal generator circuit 20 has a control signal generator circuit 22 which generates control signals 22A, 22B in response to the store signal STORE and recall signal RECALL; inverters 24, 25 which shape the waveforms of the plate signals PL; AND gates 26, 27 which output the plate signals PL according to the control signals 22A, 22B; and a delay chain circuit 28 comprising inverters in a plurality of stages.

As shown in FIG. 4, the plate signal generator circuit 20 of FIG. 10 generates first and second plate signals PL1 and PL2 in the store operation, and generates only a first plate signal PL1 in the recall operation. Further, by providing a delay chain circuit 28 in the propagation route of the second plate signal, the timing of both the rising and falling of the second plate signal PL2 can be delayed beyond those of the first plate signal PL1, as in FIG. 9.

Figure 11:
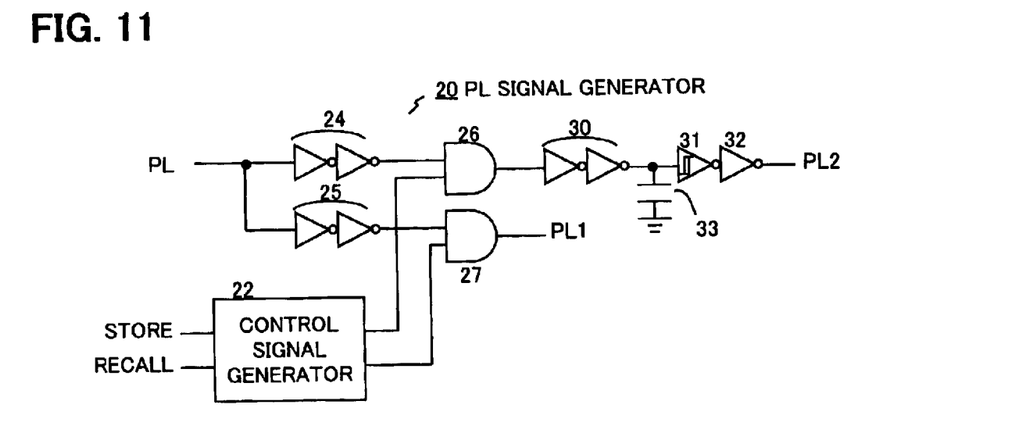
FIG. 11 is another plate signal generator circuit diagram to generate a first waveform example.

FIG. 11 is a circuit diagram of another plate signal generator which generates the first waveform example. In this example, in place of the delay chain circuit 28 of FIG. 10, an inverter 30, delay capacitor 33, Schmitt trigger 31, and inverter 32 are provided. The Schmitt trigger is a gate with a comparatively high inversion threshold voltage during rising input, and a comparatively low inversion threshold voltage during falling input and its voltage gain is very high since it utilizes the positive feedback. The delay capacitor 33 causes the rising and falling of the propagating signal to become gradual, and the Schmitt trigger 31 applies a delay time to the second plate signal PL2 according to the rising and falling slopes. Hence the waveforms of the generated first and second plate signals become the same as in FIG. 9. However, in FIG. 11 numerous inverter stages for a delay chain 28 is not necessary, and so the circuit scale can be reduced.

Figure 12:
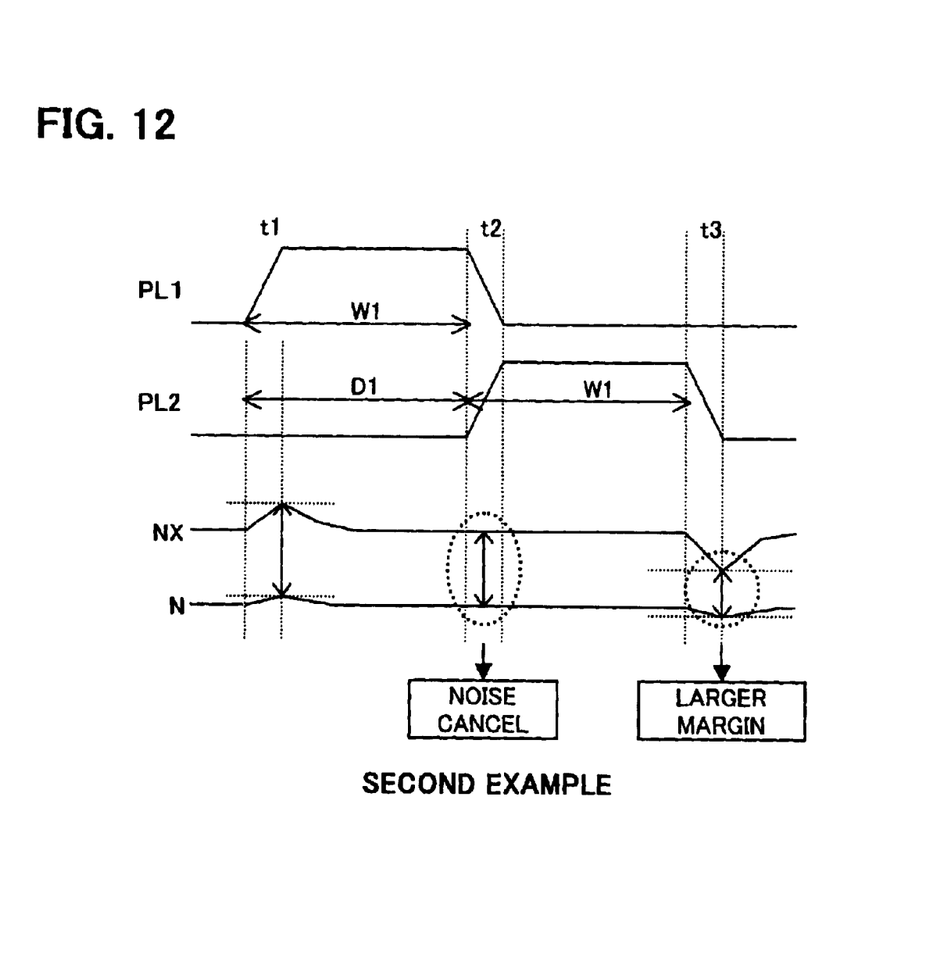
FIG. 12 is a waveform diagram showing a second example of a plate signal of this aspect.

FIG. 12 is a waveform diagram showing a second example of a plate signal in this aspect. In this example, the timing of the falling of the first plate signal PL1 and the rising of the second plate signal PL2 substantially coincide. As a result, at time t2 the coupling noise direction accompanying driving of both plate signals PL1 and PL2 is reversed, and noise is canceled. At times t1 and t3, only a single plate signal performs driving, so that the coupling noise is reduced and the operation margin is increased. In the example of FIG. 12, the pulse width W1 and delay amount D1 of the first plate signal and second plate signal are equal, so that both plate signals PL1, PL2 are generated from a common pulse signal, and the timing of the falling of the first plate signal PL1 is made to coincide with the timing of the rising of the second plate signal PL2.

Here, to make the timing of the above rising and falling "substantially coincide" means that there is coincidence to the extent that there is overlap of at least portion of the interval of the rising of one signal and he interval of the falling of the other signal.

Figure 13:
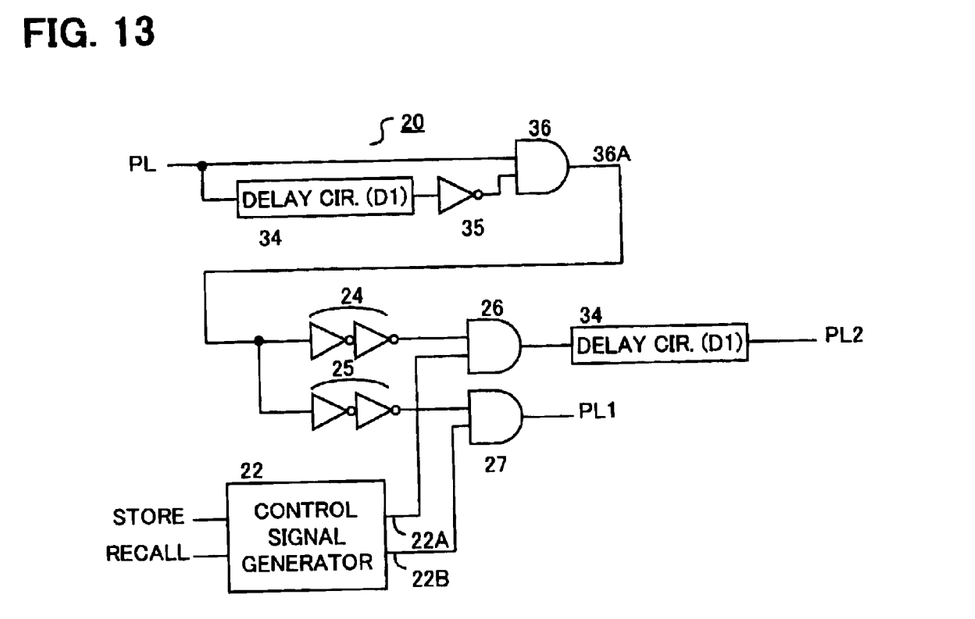
FIG. 13 is a plate signal generator circuit diagram to generate a second waveform example.

FIG. 13 is a circuit diagram of the plate signal generator to generate the second waveform example. In this circuit, a pulse signal 36A with the same pulse width as the delay time D1 is generated from the common plate signal PL by the delay circuit 34, inverter 35, and AND gate 36. Based on this signal 36A, the first and second plate signals PL1, PL2 are generated. And, the same delay circuit 34 is provided in the propagation route of the second plate signal PL2, so that the second plate signal PL2 is delayed by the delay time D1 compared with the first plate signal PL1. As a result, as shown in FIG. 12, the two plate signals PL1 and PL2 have the same pulse width (W1=D1), and the PL2 waveform is delayed by one pulse width. Consequently the timing of the falling edge of the first plate signal PL1 and the rising edge of the second plate signal PL2 match.

Figure 14:
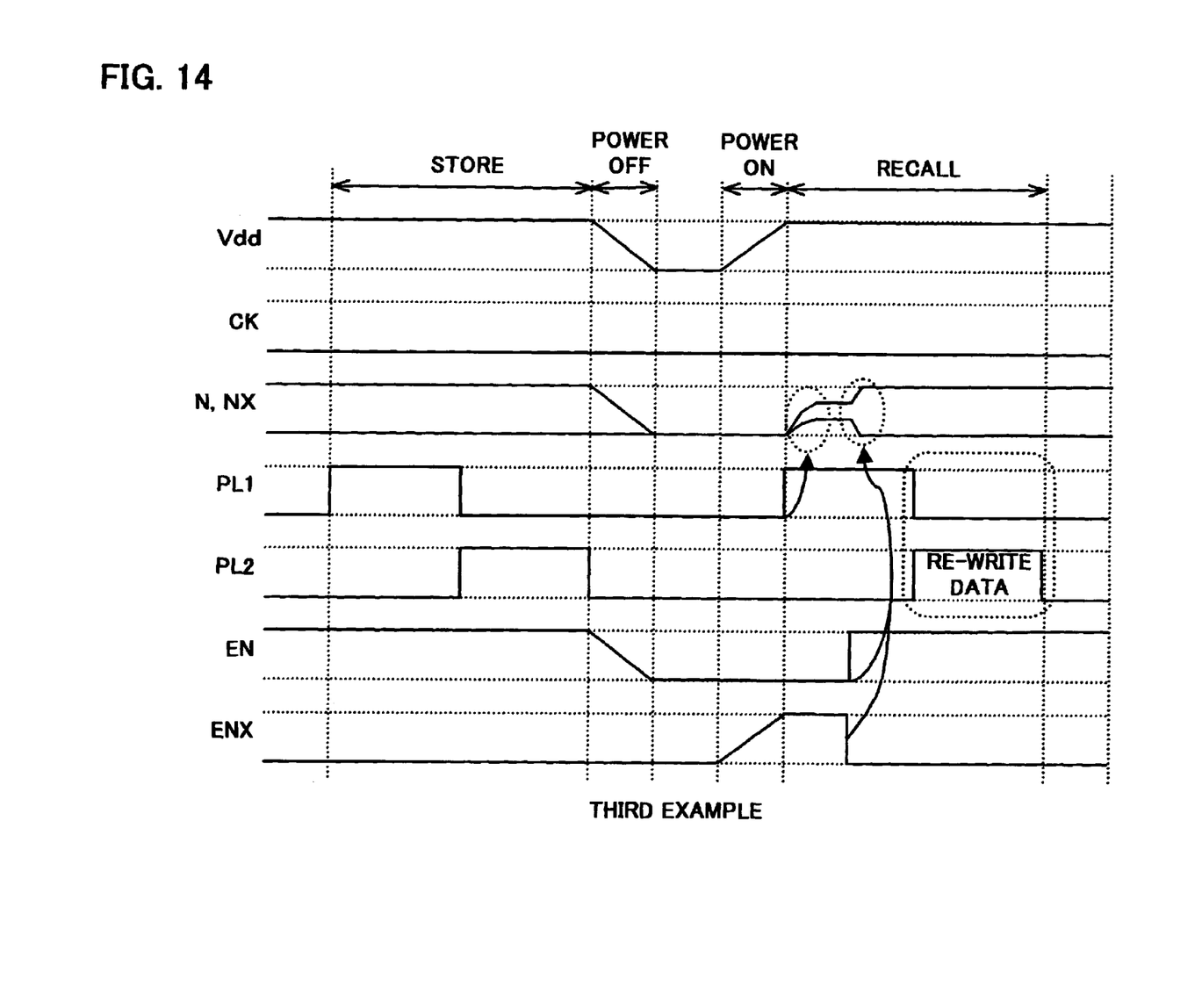
FIG. 14 is a waveform diagram showing a third example of a plate signal of this aspect.

FIG. 14 is a waveform diagram showing a third example of a plate signal of this aspect. In FIG. 14, similarly to FIG. 4, the store operation before the power supply is turned off and the recall operation after the power supply is turned on are shown. What is different from FIG. 4 is that, during the store operation, the fall timing of one of the two plate signals PL1 and PL2 and the rise timing of the other coincide, and that, during recall, after driving the first plate signal PL1, the second plate signal PL2 is also driven. More exactly, the relation between the two plate signals is the same during the store operation and during the recall operation.

In the store operation, the rise timing of the first plate signal PL1 and second plate signal PL2 is shifted, and the fall timing is also shifted. Further, the fall timing of the first plate signal PL1 and the rise timing of the second plate signal PL2 coincide. Hence as explained in FIG. 12, coupling noise with the storage nodes of the latch circuit is dispersed or canceled, and so data inversion in the latch circuit due to coupling noise is suppressed.

In the recall operation, the first plate signal PL1 rises first. As a result, due to the above-described principle, a voltage difference is generated between the storage nodes N and NX. In this state, the activation signals EN and ENX are respectively driven to the H level and L level, and the latch circuit 12 is activated. Together with this the voltage difference between the storage node pair is amplified, and the original data is latched.

From this state, by lowering the first plate signal PL1 to L level, polarization states corresponding to the data are generated in the ferroelectric capacitors FC1 and FC2. That is, rewriting to the ferroelectric capacitors FC1 and FC2 is completed. Further, in this waveform example, the second plate signal PL2 is driven to H level, and thereafter is returned to L level. As a result, polarization states corresponding to the data are also generated in the ferroelectric capacitors FC3 and FC4. Hence data is rewritten to all of the ferroelectric capacitors FC1 to FC4, so that even if the power supply falls immediately afterward due to some accident, the data would be held in the ferroelectric capacitors, and when the power supply was again turned on, the data could be recalled to the latch circuit.

Figure 15:
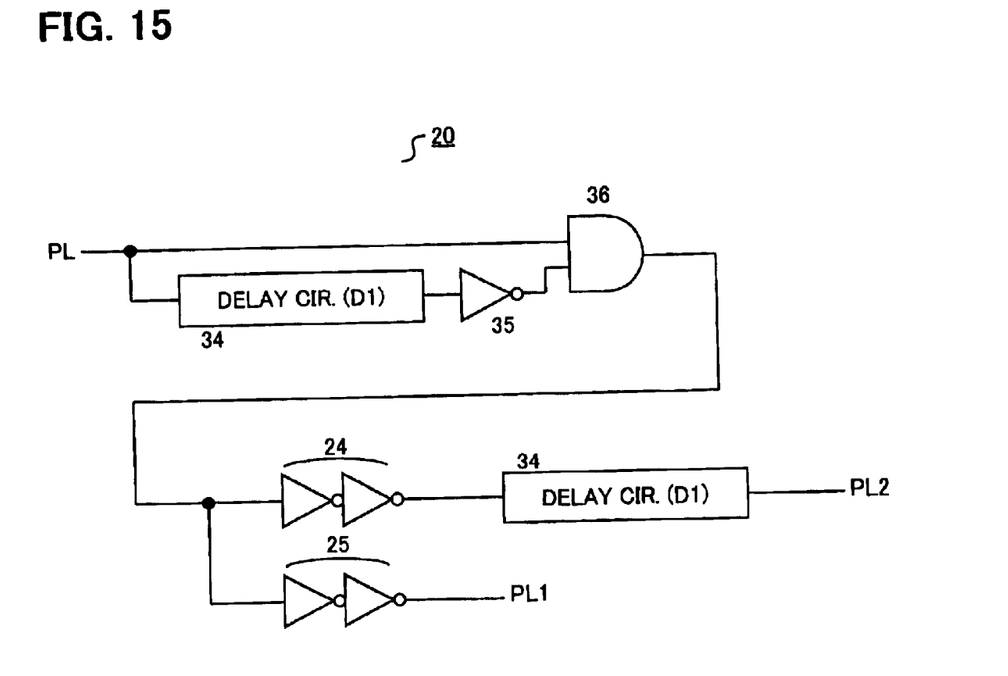
FIG. 15 is a plate signal generator circuit diagram to generate a third waveform example.

In the waveform example of FIG. 14, the first and second plate signals PL1 and PL2 are the same during the store operation and recall operation. Hence the configuration of the circuit to generate these plate signals can be made simple. FIG. 15 is a circuit diagram of a plate signal generator for the third waveform example. The plate signal generator circuit of FIG. 15 is obtained by removing the control signal generator circuit 22 and AND gates 26, 27 from the circuit of FIG. 13. That is, the same plate signals are generated in the store operation and the recall operation, so that circuits relating to these are unnecessary. In the circuit example of FIG. 15 also, the first and second plate signals PL1 and PL2 have the same pulse width, and one of the signals is shifted by one pulse width.

Figure 16:
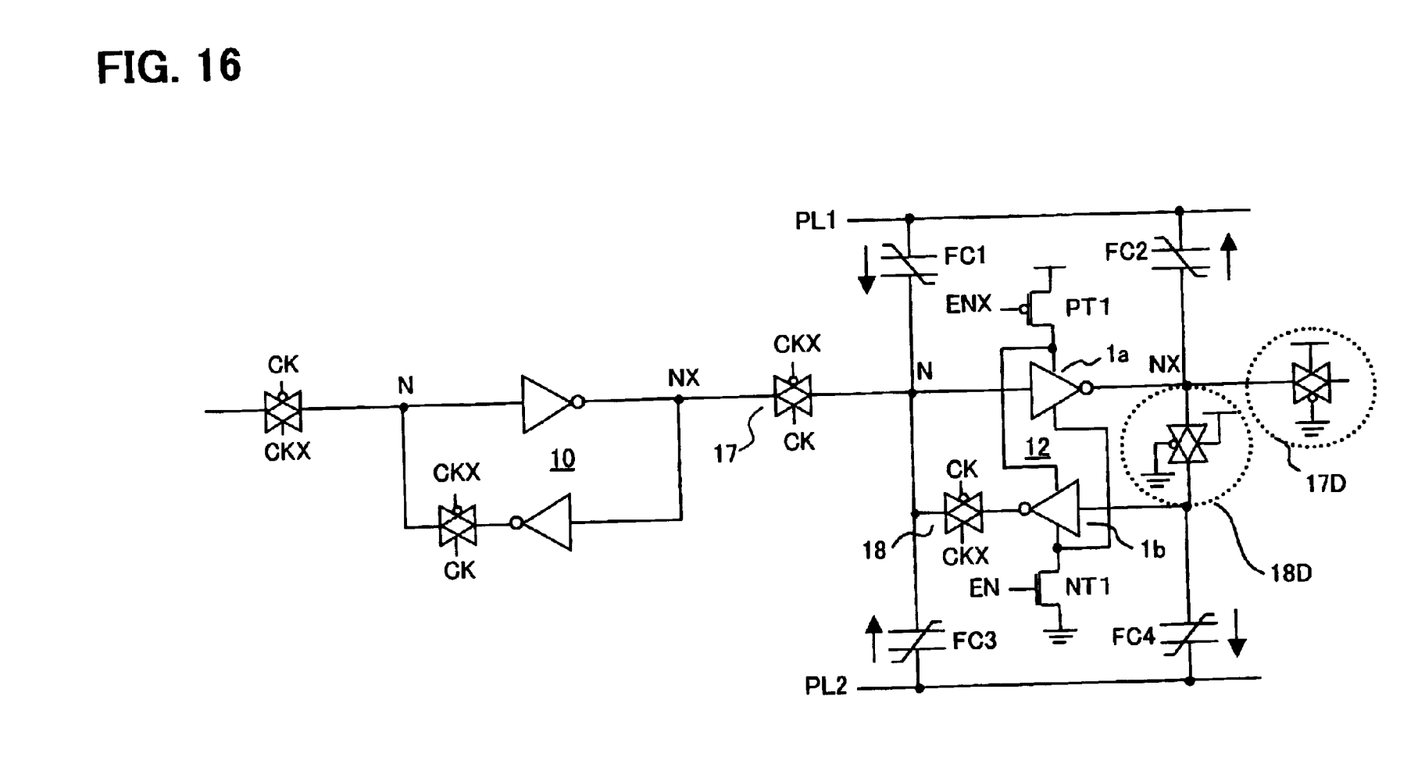
FIG. 16 is a diagram showing a modified example of a nonvolatile latch circuit of this aspect; and, FIG. 17 is a diagram showing a memory circuit of this aspect.

FIG. 16 is a diagram showing a modified example of a nonvolatile latch circuit of this aspect. In this example, as described above, the slave latch 12 of the flip-flop circuit is made nonvolatile. In this circuit, in order to balance and make equal the parasitic capacitances of the storage node pair N, NX of the slave latch circuit 12, dummy gates 17D and 18D are added. That is, the transfer gates 17 and 18 are connected to the node N, and as a result the junction capacitances of the CMOS transistor exist as parasitic capacitances of the node N. Hence in order to provide the same parasitic capacitances to the other node NX, CMOS transfer gates 17D, 18D which are always in the conducting state are provided. By equalizing the parasitic capacitances of the storage nodes N and NX, the occurrence of data inversion due to coupling noise during store operations can be suppressed.

Further, in the modified example of FIG. 16, although not shown, the shapes of the p-channel and n-channel transistors of the pair of inverters 1a, 1b of the slave latch circuit 12 are designed such that the current driving ability of the two transistors is approximately the same. That is, for example, the transistor sizes (channel width, channel length, and so on), impurity concentrations, and other parameters which affect driving ability, are made approximately the same. Stated more strictly, if the current driving abilities of the p-channel transistor of one inverter and the n-channel transistor of the other inverter are approximately the same, the effect of coupling noise can be made approximately the same. Thus if there is no imbalance in the current driving abilities of the transistors of the pair of inverters, the above-described data inversion due to coupling at the time of store operations can be suppressed.

Figure 17:
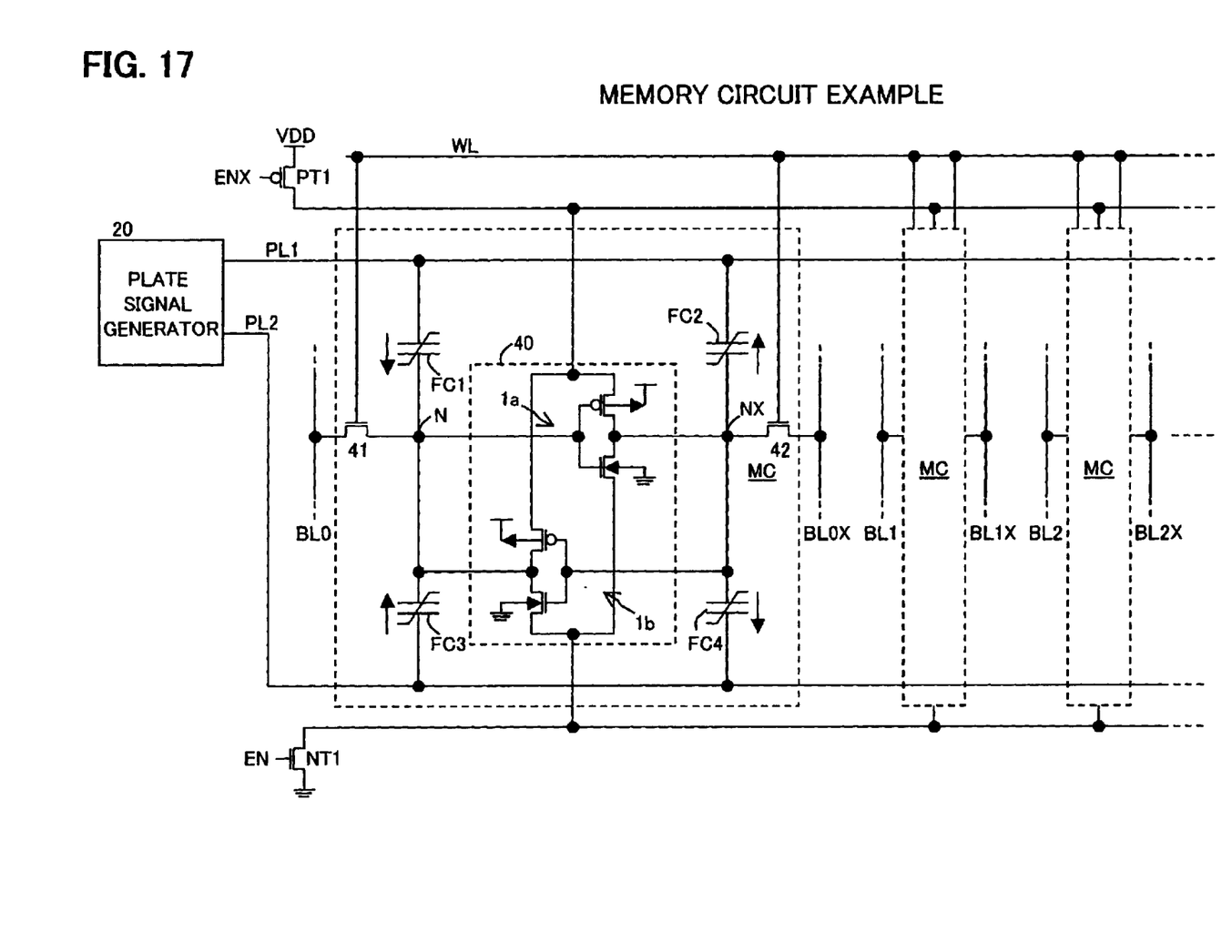

FIG. 17 is a diagram showing a memory circuit of this embodiment. The nonvolatile latch circuit of this embodiment can be used as a memory cell in a memory circuit. In the memory circuit of FIG. 17, memory cells MC are provided at the positions of intersection of the word line WL and the bit line pairs BL0, BL0X to BL2, BL2X. The memory cell MC has a latch circuit 40, comprising a pair of inverters 1a, 1b; four ferroelectric capacitors FC1 to FC4, connected to the storage nodes N, NX; and transfer transistors 41, 42 connected to the word line WL and bit line pair BL0, BL0X. Activation transistors PT1, NT1 are provided in common for all the memory cell latch circuits 40, and these transistors are driven by the activation signals ENX, EN.

Further, the first plate signal PL1 and second plate signal PL2 are supplied from the plate signal generator circuit 20 to the opposite-side electrodes of the ferroelectric capacitors FC1 to FC4 of each memory cell. These plate signals PL1, PL2 have the same waveforms and timing as in the above-described aspect.

In these memory circuits, while the power supply is turned on, the latch circuits 40 of each memory cell are in the activated state, and operation is similar to that of a normal SRAM. When the power supply is turned off, plate signals PL1, PL2 are generated with shifted timing, and polarization states are generated in the ferroelectric capacitors according to the data at the storage node pairs N, NX of each memory cell. When the power supply is turned on, after the plate signal PL1 is generated, the latch circuits of the memory cells are activated by the activation signals EN, ENX, and data is restored. Thereafter, the second plate signal PL2 is also driven, and data rewriting is performed.

As described above, by means of this aspect, it is possible to prevent data inversion during a data store operation in a nonvolatile data holding circuit using ferroelectric capacitors. Also, rewriting of data to the ferroelectric capacitors can be performed in a recall operation.

Further, in the above-described aspect ferroelectric capacitors were provided in the slave latch circuit of a flip-flop to render the circuit nonvolatile; however, ferroelectric capacitors may be similarly provided in the master latch circuit to render the circuit nonvolatile.

Thus by means of this invention, in a nonvolatile data storage circuit employing ferroelectric capacitors, operation during data restore operations can be stabilized.

What is claimed is:

1. A nonvolatile data storage circuit, comprising:
    a data holding circuit having a storage node; and
    a plurality of ferroelectric capacitors one electrode of each of which is connected to said storage node; wherein
    during a store operation to write data from said data holding circuit to said plurality of ferroelectric capacitors, a plurality of plate signals are supplied to the other electrodes of said plurality of ferroelectric capacitors, timing of either rising or falling, or of both the rising and falling of the plurality of plate signals being made different, and
    wherein said data holding circuit comprises a latch circuit in which input and output terminals of a pair of inverters are cross-connected, and said storage node is the pair of input and output terminals.

2. The nonvolatile data storage circuit according to claim 1, wherein the plurality of ferroelectric capacitors connected to said storage node have a first and a second ferroelectric capacitor, and the timing of the falling of a first plate signal and the timing of the rising of a second plate signal, applied to said first and second ferroelectric capacitors, substantially coincide.

3. The nonvolatile data storage circuit according to claim 2, wherein said data holding circuit comprises an activation circuit which activates the data holding circuit in response to an activation signal; and, during a recall operation to write data from said ferroelectric capacitors to said data holding circuit, after said first plate signal has been driven, said data holding circuit is activated by said activation circuit.

4. The nonvolatile data storage circuit according to claim 3, wherein during said recall operation, after activation of said data holding circuit, said second plate signal is driven to write data to said ferroelectric capacitors.

5. The nonvolatile data storage circuit according to claim 3, wherein during said store operation and said recall operation, said first and second plate signals have the same timing waveforms.

6. A nonvolatile data storage circuit, comprising:
    a data latch circuit having first and second storage nodes;
    first and second ferroelectric capacitors one electrode of which is connected to said first storage node, and third and fourth ferroelectric capacitors one electrode of which is connected to said second storage node; wherein
    during a store operation to write data of said data latch circuit to said ferroelectric capacitors, a first plate signal is supplied to the other electrodes of said first and third ferroelectric capacitors, a second plate signal is supplied to the other electrodes of said second and fourth ferroelectric capacitors, and the timing of either the rising or the falling, or both, of said first and second plate signals are made different.

7. The nonvolatile data storage circuit according to claim 6, wherein during said store operation, the timing of the falling of said first plate signal and the rising of said second plate signal substantially coincide.

8. The nonvolatile data storage circuit according to claim 6, wherein during the recall operation to write the data from said ferroelectric capacitors to the data latch circuit, said first plate signal is supplied to the other electrodes of said first and third ferroelectric capacitors, then said data latch circuit is activated, and thereafter, said second plate signal is supplied to the other electrodes of said second and fourth ferroelectric capacitors.

9. The nonvolatile data storage circuit according to claim 6, wherein a dummy gate circuit is connected to either said first storage node or to said second storage node to equalize the parasitic capacitances.

10. The nonvolatile data storage circuit according to claim 6, wherein said data latch circuit has a pair of inverters with input and output terminals cross-connected, and the pair of inverters have a p-channel transistor and an n-channel transistor, having substantially same current driving abilities.

11. A nonvolatile data storage circuit, comprising:
    a data holding circuit having a storage node; and
    a pair of ferroelectric capacitors one electrode of each of which is connected to said storage node; wherein
    during a recall operation to rewrite data from said ferroelectric capacitors to said data holding circuit, the timing of first and second plate signals supplied to the other electrodes of said pair of ferroelectric capacitors is shifted, when said first plate signal is applied said data holding circuit is activated to latch the data, and thereafter said second plate signal is applied.

12. A nonvolatile memory circuit, comprising:
    a plurality of word lines;
    a plurality of bit line pairs; and
    a plurality of memory cells placed at positions of intersection of said word lines and said bit line pairs; wherein
    each of said memory cells has a data latch circuit having first and second storage nodes, first and second ferroelectric capacitors one electrode of each of which is connected to said first storage node, and third and fourth ferroelectric capacitors one electrode of each of which is connected to said second storage node; and,
        during a store operation to write data from said data latch circuit to said ferroelectric capacitors, a first plate signal is supplied to the other electrodes of said first and third ferroelectric capacitors, a second plate signal is supplied to the other electrodes of said second and fourth ferroelectric capacitors, and timing of either rising or falling, or both, of said first and second plate signals is different.

13. The nonvolatile memory circuit according to claim 12, wherein during said store operation, the timing of the falling of said first plate signal and of the rising of said second plate signal substantially coincide.

14. The nonvolatile memory circuit according to claim 12, wherein during a recall operation to write the data from said ferroelectric capacitors to the data latch circuit, said first plate signal is supplied to the other electrodes of said first and third ferroelectric capacitors, then said data latch circuit is activated, and thereafter, said second plate signal is supplied to the other electrodes of said second and fourth ferroelectric capacitors.

* * * * *